(12) United States Patent
Kawaguchi et al.

(10) Patent No.: US 7,792,172 B2
(45) Date of Patent: Sep. 7, 2010

(54) NITRIDE SEMICONDUCTOR LASER DEVICE

(75) Inventors: Yoshinobu Kawaguchi, Mihara (JP);
Takeshi Kamikawa, Tenri (JP);
Shigetoshi Ito, Shijyonawate (JP)

(73) Assignee: Sharp Kabushiki Kaisha, Osaka (JP)

( * ) Notice: Subject to any disclaimer, the term of this patent is extended or adjusted under 35 U.S.C. 154(b) by 57 days.

(21) Appl. No.: 12/285,337

(22) Filed: Oct. 2, 2008

(65) Prior Publication Data

US 2009/0116528 A1    May 7, 2009

(30) Foreign Application Priority Data

Oct. 4, 2007    (JP)  ............... 2007-260960

(51) Int. Cl.
*H01S 5/00* (2006.01)
(52) U.S. Cl. ............... 372/49.01; 372/44.011
(58) Field of Classification Search ............ 372/44.011, 372/49.01
See application file for complete search history.

(56) References Cited

U.S. PATENT DOCUMENTS

| 2001/0048114 | A1 |   | 12/2001 | Morita et al. |           |
|--------------|----|---|---------|---------------|-----------|
| 2008/0198886 | A1 | * | 8/2008  | Michiue et al. | 372/44.011 |
| 2009/0086778 | A1 | * | 4/2009  | Kameyama et al. | 372/44.01 |
| 2009/0086783 | A1 |   | 4/2009  | Kameyama et al. |          |

FOREIGN PATENT DOCUMENTS

| JP | 08-213692 | 8/1996 |
| JP | 10-335750 | 12/1998 |
| JP | 2006-203162 | 8/2006 |
| JP | 2007-189201 | 7/2007 |
| JP | 2007-273951 | 10/2007 |
| JP | 2009-099958 | 5/2009 |
| JP | 2009-099959 | 5/2009 |

OTHER PUBLICATIONS

K. Okamaoto et al., "Continous-Wave Operation of m-Plane In GaN Multiple Quantum Well Laser Diodes", Japanese Journal of Applied Physics, vol. 46, No. 9, 2007.

* cited by examiner

*Primary Examiner*—Armando Rodriguez
(74) *Attorney, Agent, or Firm*—Harness, Dickey & Pierce, P.L.C.

(57) ABSTRACT

A nitride semiconductor laser device has a multilayer structure formed by stacking a plurality of nitride semiconductor layers made of hexagonal nitride semiconductors, while the multilayer structure is provided with a waveguide structure for guiding a laser beam, the nitride semiconductor layers forming the multilayer structure are stacked in a direction substantially perpendicular to the c-axes of the hexagonal nitride semiconductors constituting the nitride semiconductor layers, a first cavity facet forming a side surface of the waveguide structure is a c-plane having Ga-polarity, a second cavity facet forming another side surface of the waveguide structure opposed to the first cavity facet is a c-plane having N-polarity, a crystalline nitrogen-containing film is formed on the surface of the first cavity facet, and the reflectance of the first cavity facet is smaller than the reflectance of the second cavity facet.

12 Claims, 1 Drawing Sheet

NITRIDE SEMICONDUCTOR LASER DEVICE

This nonprovisional application is based on Japanese Patent Application No. 2007-260960 filed on Oct. 4, 2007 with the Japan Patent Office, the entire contents of which are hereby incorporated by reference.

BACKGROUND OF THE INVENTION

1. Field of the Invention

The present invention relates to a nitride semiconductor laser device, and more particularly, it relates to a nitride semiconductor laser device, including growth surfaces of a-planes or m-planes, having an excellent high output characteristic and high reliability.

2. Description of the Background Art

A light-emitting device employing nitride-group III-V compound semiconductors is put into practice nowadays. Such a light-emitting device employs nitride semiconductor layers made of hexagonal nitride semiconductors, which are grown on the surface, formed by a c-plane, of a substrate made of sapphire or GaN. Therefore, the growth surface of each nitride semiconductor layer made of the hexagonal nitride semiconductor is the (0001) plane (c-plane).

The growth surface is parallel to the surface of the substrate, and the nitride semiconductor layer is mainly grown in the normal direction thereof. The nitride semiconductor grown on the c-plane has spontaneous polarization due to the hexagonal crystal system. When a heterojunction is formed with this hexagonal nitride semiconductor, strain results from lattice mismatching, to generate a piezoelectric field.

An internal field resulting from the spontaneous polarization and the piezoelectric field bends the band structure. In a quantum well employed for an active layer of a light-emitting device such as a light-emitting diode or a semiconductor laser device employing hexagonal nitride semiconductors, superposition of the wave functions of a conduction band and a valence band is reduced due to the band structure bent by the internal field, to reduce the luminous efficiency of the light-emitting device.

Particularly in the semiconductor laser device, the threshold current is disadvantageously increased due to the reduction in the luminous efficiency resulting from the internal field. Further, the strength of the piezoelectric field is increased as the strain is increased, and hence the luminous efficiency is remarkably reduced as the In composition is increased if the active layer is made of a nitride-group III-V compound semiconductor such as InGaN containing In. In this case, therefore, it is difficult to increase the wavelength of the laser beam emitted from the semiconductor laser device.

In order to solve such problems of the light-emitting device employing the nitride semiconductors grown on the c-planes, a light-emitting device employing nitride semiconductor layers made of hexagonal nitride semiconductors grown on (11-20) planes (a-planes) or (1-100) planes (m-planes) so that no internal field is generated is currently in the process of research and development (refer to Kuniyoshi Okamoto et al., "Continuous-Wave Operation of m-Plane InGaN Multiple Quantum Well Laser Diodes", Japanese Journal of Applied Physics, Vol. 46, No. 9, 2007, pp. L187 to L189 (Non-Patent Document 1), for example).

However, while a technique of forming a protective film on a cavity facet in order to obtain an excellent high output characteristic and high reliability is disclosed (refer to Japanese Patent Laying-Open No. 2006-203162 (Patent Document 1), for example) as to a conventional nitride semiconductor laser device employing nitride semiconductor layers made of hexagonal nitride semiconductors grown on c-planes, no specific technique for obtaining an excellent high output characteristic and high reliability is examined as to a nitride semiconductor laser device including growth surface of a-planes or m-planes.

SUMMARY OF THE INVENTION

In consideration of the aforementioned circumstances, an object of the present invention is to provide a nitride semiconductor laser device, including growth surfaces of a-planes or m-planes, having an excellent high output characteristic and high reliability.

The nitride semiconductor laser device according to the present invention has a multilayer structure formed by stacking a plurality of nitride semiconductor layers made of hexagonal nitride semiconductors, while the multilayer structure is provided with a waveguide structure for guiding a laser beam, the nitride semiconductor layers forming the multilayer structure are stacked in a direction substantially perpendicular to the c-axes of the hexagonal nitride semiconductors constituting the nitride semiconductor layers, a first cavity facet forming a side surface of the waveguide structure is a c-plane having Ga-polarity, a second cavity facet forming another side surface of the waveguide structure opposed to the first cavity facet is a c-plane having N-polarity, a crystalline nitrogen-containing film is formed on the surface of the first cavity facet, and the reflectance of the first cavity facet is smaller than the reflectance of the second cavity facet.

In the nitride semiconductor laser device according to the present invention, the direction substantially perpendicular to the c-axes of the hexagonal nitride semiconductors constituting the nitride semiconductor layers preferably has inclination of not more than 3° with respect to a direction completely perpendicular to the c-axes of the hexagonal nitride semiconductors constituting the nitride semiconductor layers.

In the nitride semiconductor laser device according to the present invention, an oxide film is preferably formed on the nitrogen-containing film.

In the nitride semiconductor laser device according to the present invention, the crystal axis of the nitrogen-containing film is preferably aligned with the crystal axis of the first cavity facet.

In the nitride semiconductor laser device according to the present invention, the nitride semiconductor layers forming the multilayer structure are preferably stacked in a direction substantially parallel to the a-axes or the m-axes of the hexagonal nitride semiconductors constituting the nitride semiconductor layers.

In the nitride semiconductor laser device according to the present invention, the direction substantially parallel to the a-axes or the m-axes of the hexagonal nitride semiconductors constituting the nitride semiconductor layers preferably has inclination of not more than 3° with respect to the a-axes or the m-axes of the hexagonal nitride semiconductors constituting the nitride semiconductor layers.

According to the present invention, a nitride semiconductor laser device, including growth surfaces of a-planes or m-planes, having an excellent high output characteristic and high reliability can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
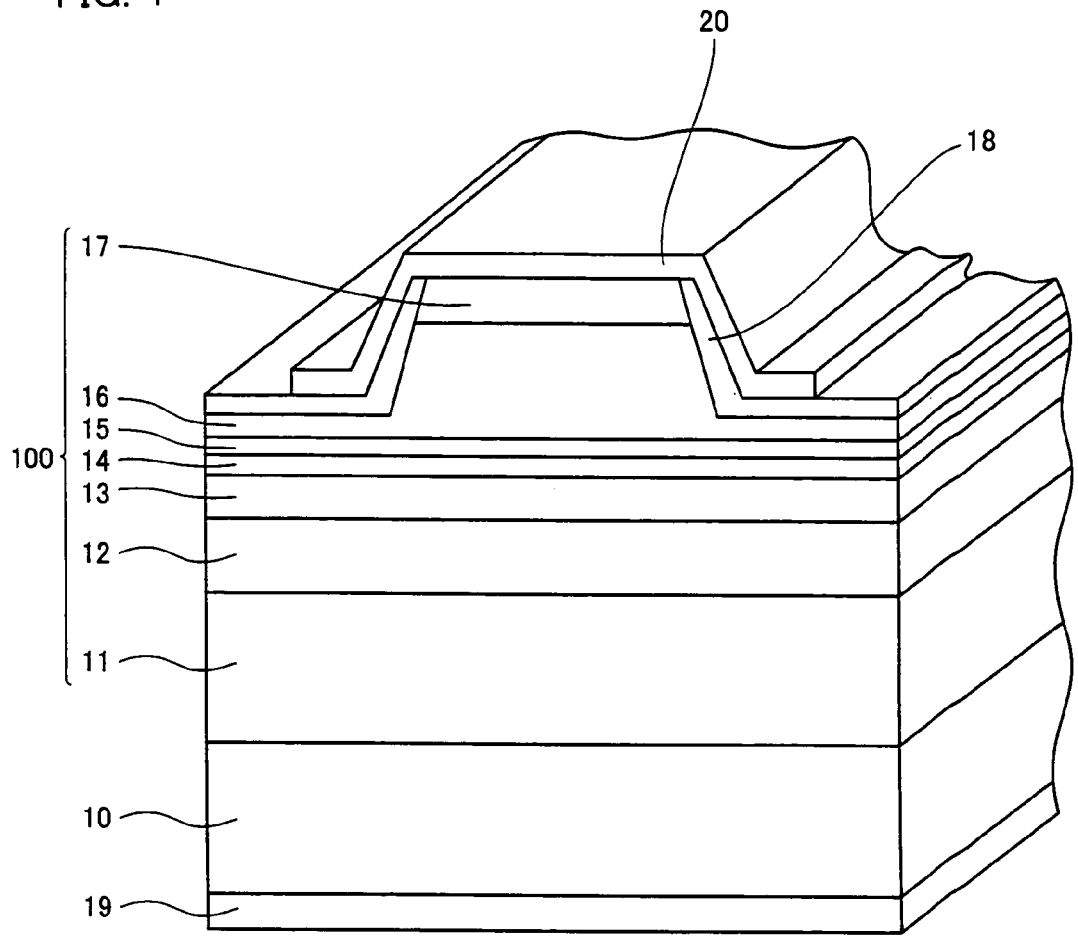
FIG. 1 is a schematic perspective sectional view showing a nitride semiconductor laser device according to an embodiment of the present invention.

In the following, an embodiment of the present invention will be described. It is noted that in the figure of the present invention, the same reference characters refer to the same parts or corresponding parts.

FIG. 1 is a schematic perspective sectional view of a nitride semiconductor laser device according to the embodiment of the present invention. The nitride semiconductor laser device shown in FIG. 1 has a multilayer structure 100 formed by successively stacking an n-type buffer layer 11 of n-type GaN having a thickness of 0.2 μm, an n-type clad layer 12 of n-type $Al_{0.06}Ga_{0.94}N$ having a thickness of 2.3 μm, an n-type guide layer 13 of n-type GaN having a thickness of 0.02 μm, an active layer 14 having a multiple quantum well structure formed by a multiple quantum well layer consisting of an InGaN layer having a thickness of 4 nm and a GaN layer having a thickness of 8 nm and a protective layer of GaN having a thickness of 70 nm, a p-type current blocking layer 15 of p-type $Al_{0.3}Ga_{0.7}N$ having a thickness of 20 nm, a p-type clad layer 16 of p-type $Al_{0.05}Ga_{0.95}N$ having a thickness of 0.5 μm and a p-type contact layer 17 of p-type GaN having a thickness of 0.1 μm on a substrate 10 of n-type GaN in this order by epitaxial growth, for example.

In order to horizontally confine a laser beam emitted from the nitride semiconductor laser device, a ridge stripe structure having a ridge stripe portion is provided by partially removing p-type clad layer 16 in a striped manner thereby partially protruding p-type clad layer 16. Insulating films 18 are formed on both sides of the ridge stripe portion, in order to inject a current only into the ridge stripe portion. Insulating films 18 can be made of silicon oxide or zirconium oxide, for example. A region of active layer 14 located under this ridge stripe portion forms a waveguide structure for guiding the emitted laser beam.

The wavelength of the laser beam emitted from the nitride semiconductor laser device according to the present invention is not particularly restricted, but can be set to at least 400 nm and not more than 410 nm, for example.

The breadth of the ridge stripe portion can be properly changed in response to the application of the nitride semiconductor laser device. For example, the breadth of the ridge stripe portion can be set to at least about 1 μm and not more than about 3 μm if the nitride semiconductor laser device is applied to an optical disk or the like which must have a single mode in the horizontal direction, while the breadth can be set to at least about 3 μm and not more than about 100 μm if the nitride semiconductor laser device is applied to lighting fitting or the like which may not have a single mode in the horizontal direction. In place of the ridge stripe structure, a current narrowing structure can be employed by providing a high-resistance layer in the multilayer structure formed on substrate 10.

In order to inject the current into the nitride semiconductor laser device, an n electrode 19 is formed on the back surface of substrate 10, and a p electrode 20 is formed on the surface of p-type contact layer 17.

One of the features of the present invention resides in that the nitride semiconductor layers (n-type buffer layer 11, n-type clad layer 12, n-type guide layer 13, active layer 14, p-type current blocking layer 15, p-type clad layer 16 and p-type contact layer 17 in this embodiment) constituting the multilayer structure (multilayer structure 10 in this embodiment) are stacked in a direction substantially perpendicular to the c-axes of the hexagonal nitride semiconductors constituting the aforementioned nitride semiconductor layers (i.e., a direction substantially parallel to the a-axes or the m-axes of the hexagonal nitride semiconductors constituting the aforementioned nitride semiconductor layers).

Thus, the nitride semiconductor layers can be grown on the a-planes or the m-planes by stacking the nitride semiconductor layers in the direction substantially perpendicular to the c-axes of the hexagonal nitride semiconductors constituting the nitride semiconductor layers (direction parallel to the a-axes or the m-axes of the hexagonal nitride semiconductors). Therefore, the nitride semiconductor laser device can be prevented from reduction of luminous efficiency caused by internal fields resulting from spontaneous polarization and piezoelectric fields generated when the nitride semiconductors are stacked in a direction parallel to the c-axes of the hexagonal nitride semiconductors constituting the nitride semiconductor layers as in the prior art, whereby a nitride semiconductor laser device having superior luminous efficiency as compared with the conventional nitride semiconductor laser device having the nitride semiconductor layers stacked in the direction parallel to the c-axes of the hexagonal nitride semiconductors constituting the nitride semiconductor layers.

The a-axis direction or the m-axis direction, for example, can be selected as the direction substantially perpendicular to the c-axes of the hexagonal nitride semiconductors constituting the nitride semiconductor layers, and the nitride semiconductor layers are so grown on the surface of the a-plane or the m-plane of substrate 10 that the aforementioned nitride semiconductor layers can be stacked in the direction substantially perpendicular to the c-axes of the hexagonal nitride semiconductors constituting the nitride semiconductor layers.

Substrate 10 is not restricted to the aforementioned structure, but may alternatively be formed by a sapphire substrate having a surface of the (10-12) plane (r-plane), for example. In this case, the aforementioned nitride semiconductor layers consisting of crystals of the hexagonal nitride semiconductors are so successively grown on the r-plane of the sapphire substrate that the aforementioned nitride semiconductor layers can be stacked in the direction substantially perpendicular to the c-axes of the hexagonal nitride semiconductors constituting the nitride semiconductor layers.

In the present invention, the "direction substantially perpendicular to the c-axes" is a concept including not only a direction (completely perpendicular to the c-axes) forming an angle of 90° with the c-axis direction but also a direction forming an angle of 90°±3° with the c-axis direction. In order to improve the planarity of a crystalline nitrogen-containing film formed on a first cavity facet described later for providing a nitride semiconductor laser device having a superior high output characteristic and higher reliability, however, the "direction substantially perpendicular to the c-axes" is preferably the direction (having inclination of not more than 3° with respect to the direction completely perpendicular to the c-axes) forming the angle of 90°±3° with the c-axis direction, excluding the direction (completely perpendicular to the c-axes) forming the angle of 90° with the c-axis direction.

In the present invention, further, the "direction substantially parallel to the a-axes or the m-axes" is a concept including not only a direction (completely parallel to the a-axes or the m-axes) forming no angle with the a-axis direction or the m-axis direction but also a direction forming an angle of ±3° with the a-axis direction or the m-axis direction. In order to improve the planarity of the crystalline nitrogen-containing film formed on the first cavity facet described later for providing a nitride semiconductor laser device having a superior high output characteristic and higher reliability, however, the "direction substantially parallel to the a-axes or the m-axes" is preferably the direction (having inclination of not more than 3° with respect to the a-axis direction or the m-axis direction) forming the angle ±3° with the a-axis direction or the m-axis direction, excluding the direction (completely parallel to the a-axes or the m-axes) forming no angle with the a-axis direction or the m-axis direction.

The materials, the mixed crystal ratios and the thicknesses of the aforementioned nitride semiconductor layers as well as the number of the nitride semiconductor layers and the order of stacking these layers are properly controlled and not relevant to the subject matter of the present invention. In the present invention, the multilayer structure can be prepared by successively stacking nitride semiconductor layers consisting of crystals of hexagonal nitride semiconductors containing compounds of at least one group III element selected from a group consisting of Al (aluminum), Ga (gallium) and In (indium) and N (nitrogen) which is a group V element as main components, for example.

Figure 2:
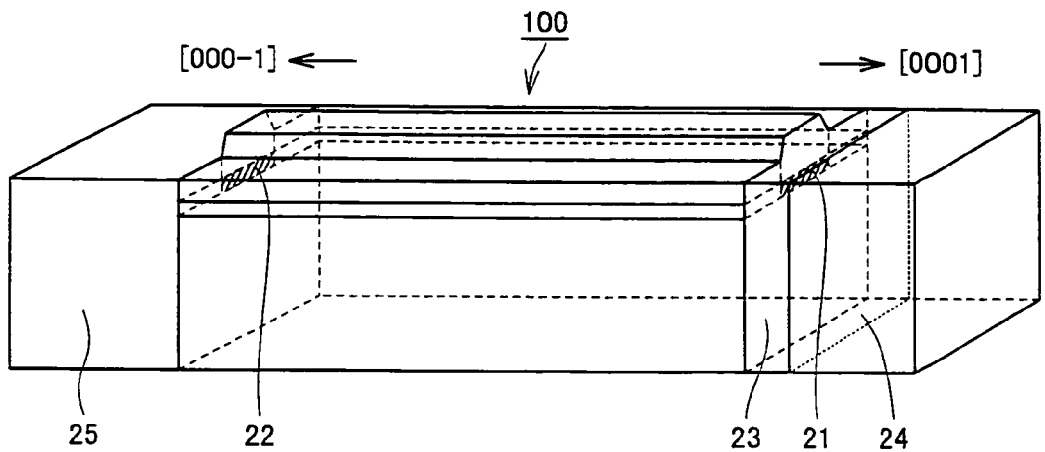
FIG. 2 is a schematic perspective view of the nitride semiconductor laser device shown in FIG. 1.

FIG. 2 is a schematic perspective view of the nitride semiconductor laser device show in FIG. 1. As shown in FIG. 2, a first cavity facet 21 serving as a main emission surface for the laser beam and a second cavity facet 22 serving as a main reflecting surface for the laser beam are formed on both side surfaces of multilayer structure 100. In the present invention, the "cavity facet" denotes an end face of the waveguide structure formed by successively stacking the nitride semiconductor layers of the hexagonal nitride semiconductors in the nitride semiconductor laser device according to the present invention.

A crystalline (a single-crystalline structure, a polycrystalline structure or a mixed crystalline structure) nitrogen-containing film 23 is formed on first cavity facet 21, while an oxide film 24 is formed on the surface of nitrogen-containing film 23. A protective film 25 is formed on second cavity facet 22.

According to the present invention, the nitride semiconductor layers constituting multilayer structure 100 are stacked in the direction substantially perpendicular to the c-axes, whereby the normal directions of first and second cavity facets 21 and 22 are substantially parallel to the c-axis direction ([0001] and [000-1] directions) of the hexagonal nitride semiconductors constituting the nitride semiconductor layers respectively.

According to the present invention, first cavity facet 21 is a c-plane having Ga (gallium)-polarity, second cavity facet 22 formed on the side surface opposed to first cavity facet 21 is a c-plane having N (nitrogen)-polarity, crystalline nitrogen-containing film 23 is formed on the surface of first cavity facet 21, and the reflectance of first cavity facet 21 is smaller than the reflectance of second cavity facet 22. The reflectance of each of first and second cavity facets 21 and 22 can be measured from the strength of light applied to and reflected by the surface whose reflectance is to be measured.

As an exemplary method of obtaining a nitride semiconductor laser device having a high output characteristic and high reliability, oxidation of an emission-side cavity facet may be suppressed. If the emission-side cavity facet is oxidized, a non-radiative recombination level is formed to absorb the laser beam emitted from the nitride semiconductor laser device. Therefore, a light-emitting portion of the emission-side cavity facet is overheated, the emission-side cavity facet is damaged, and neither the output characteristic nor the reliability of the nitride semiconductor laser device can be improved.

The inventor has found that it is effective to form a crystalline nitrogen-containing film to come into contact with hexagonal nitride semiconductors constituting the emission-side cavity facet in order to prevent oxidation of the emission-side cavity facet.

This is because an amorphous nitrogen-containing film absorbs the laser beam in a larger quantity as compared with the crystalline nitrogen-containing film and exerts bad influence on the output characteristic and the reliability of the nitride semiconductor laser device. Also in relation to thermal conductivity and chemical stability, the crystalline nitrogen-containing film is superior to the amorphous nitrogen-containing film, and can improve the output characteristic and the reliability of the nitride semiconductor laser device.

In general, a nitride semiconductor laser device has a pair of opposed cavity facets (first and second cavity facets 21 and 22 in this embodiment). Protective films are formed on these cavity facets respectively, in order to control the reflectance on the cavity facets. The reflectance of first cavity facet 21 serving as the emission surface is rendered smaller than that of second cavity facet 22, so that the laser beam can be more efficiently extracted from first cavity facet 21 than second cavity facet 22. However, first cavity facet 21 having lower reflectance exhibits higher optical density in the cavity facet than second cavity facet 22.

Therefore, the aforementioned deterioration caused by overheat on the emission side generally takes place on first cavity facet 21, and hence it is important how to form crystalline nitrogen-containing film 23 having excellent crystallinity on first cavity facet 21, in order to improve the output characteristic and the reliability of the nitride semiconductor laser device.

Crystalline nitrogen-containing film 23 is preferably formed on c-planes ((0001) planes (+c-planes)), having Ga-polarity, of the hexagonal nitride semiconductors, to exhibit superior crystallinity as compared with a case where the same is formed on c-planes ((000-1) planes (−c-planes)) having N-polarity.

When the +c-planes are selected for first cavity facet 21 and crystalline nitrogen-containing film 23 is formed on first cavity facet 21, therefore, the output characteristic and the reliability of the nitride semiconductor laser device can be further improved as compared with a case of selecting the −c-planes for first cavity facet 21 and forming nitrogen-containing film 23 on first cavity facet 21. While second cavity facet 22 is formed by the −c-planes in this case, no problem arises in general since the optical density of second cavity facet 22 is lower than that of first cavity facet 21.

When crystalline nitrogen-containing film 23 is formed on first cavity facet 21 formed by the +c-planes, further, not only the crystallinity but also the planarity of crystalline nitrogen-containing film 23 can be improved as compared with the case of forming crystalline nitrogen-containing film 23 on first cavity facet 21 formed by the −c-planes, and the shape of the emitted laser beam can be improved. The shape of the laser beam emitted from second cavity facet 22 does not come into question in general.

When crystalline nitrogen-containing film 23 is formed on first cavity facet 21 formed by the +c-planes, in addition, the chemical stability of crystalline nitrogen-containing film 23 can be improved as compared with the case of forming crystalline nitrogen-containing film 23 on first cavity facet 21 formed by the −c-planes, whereby the reliability of the nitride semiconductor laser device can be improved.

According to the present invention, the crystal axis of crystalline nitrogen-containing film 23 is preferably aligned with the crystal axis of first cavity facet 21. When the crystal axis of crystalline nitrogen-containing film 23 is aligned with the crystal axis of first cavity facet 21, the crystallinity, the planarity and the chemical stability of nitrogen-containing film 23 can be further improved, whereby the output characteristic and the reliability of the nitride semiconductor laser device can be further improved. The crystal axis of crystalline nitrogen-containing film 23 may not be completely aligned with the crystal axis of first cavity facet 21, but may be substantially aligned therewith. Whether or not the crystal axis of crystalline nitrogen-containing film 23 is aligned with the crystal axis of first cavity facet 21 can be determined by cutting the nitride semiconductor laser device in a direction allowing observation of the surface of nitride-containing film 23 closer to first cavity facet 21, taking a picture of the diffraction pattern thereof with a TEM (Transmission Electron Microscope), taking a picture of the diffraction pattern of the surface of first cavity facet 21 closer to nitrogen-containing film 23 with a TEM and comparing the diffraction patterns with each other.

The "c-plane having Ga-polarity" denotes such a c-plane, normal to the c-axis, that a Ga bond, included in four Ga bonds combined with N, in a direction parallel to the c-axis is positioned in a direction toward the N direction in chemical bonds of Ga and N in a GaN crystal forming a hexagonal nitride semiconductor, for example.

The "c-plane having N-polarity" denotes such a c-plane, normal to the c-axis, that an N bond, included in four N bonds combined with Ga, in the direction parallel to the c-axis is positioned in a direction toward the Ga direction in the chemical bonds of Ga and N in the GaN crystal forming the hexagonal nitride semiconductor, for example.

The hexagonal nitride semiconductors employed in the present invention are not restricted to GaN, and hence the aforementioned "c-planes having Ga-polarity" and "c-planes having N-polarity" include such cases that Ga is at least partially replaced with other elements such as other group III elements (Al and In).

Whether or not first cavity facet 21 is formed by the "c-planes having Ga-polarity" and whether or not second cavity facet 22 is formed by the "c-planes having N-polarity" can be determined by an analytical method referred to as CBED (Convergent Beam Electron Diffraction), for example.

First and second cavity facets 21 and 22 can be formed by cleavage respectively. In this case, multilayer structure 100 is cleaved along the c-planes of the hexagonal nitride semiconductors.

Crystalline nitrogen-containing film 23 formed on first cavity facet 21 can be made of aluminum nitride (AlN), gallium nitride (GaN) or a mixed crystal nitride semiconductor expressed as $Al_xIn_yGa_zN$ (x+y+z=1, $0\leq x\leq 1$, $0\leq y\leq 1$, $0\leq z\leq 1$), for example. In particular, a film of aluminum nitride (AlN) having excellent thermal conductivity, a large band gap and small light absorption is preferably employed. Nitrogen-containing film 23 may also contain oxygen (O), carbon (C), argon (Ar) or the like. Particularly when nitrogen-containing film 23 contains oxygen (O), adhesion to the nitride semiconductors constituting first cavity facet 21 is preferably improved.

As shown in FIG. 2, oxide film 24 may be formed on nitrogen-containing film 23. Oxide film 24 is so formed that the reflectance control range can be increased and the surface of nitrogen-containing film 23 can be prevented oxidation. In particular, oxide film 24 is preferably formed by a single layer of aluminum oxide, silicon oxide, titanium oxide, tantalum oxide, niobium oxide, hafnium oxide or yttrium oxide having sufficiently small absorption with respect to the wavelength of the emitted laser beam or a multilayer film formed by stacking at least two layers of these oxides.

The thicknesses of nitrogen-containing film 23 and oxide film 24 are so set as to obtain desired reflectance values. When nitrogen-containing film 23 is formed by an aluminum nitride film and oxide film 24 is formed by an aluminum oxide film, the reflectance of first cavity facet 21 with respect to the laser beam can be set to about 18% if the thicknesses of nitrogen-containing film 23 and oxide film 24 are 20 nm and 110 nm respectively, for example.

Second cavity facet 22 is so formed as to have the reflectance higher than that of first cavity facet 21, due to protective film 25 formed thereon. The reflectance for the laser beam can be improved to a value substantially close to 100% by stacking dielectric films having different refractive indexes as protective film 25 in general. For example, a multilayer structure of a silicon oxide film and a titanium oxide film can be employed as protective film 25. Also on second cavity facet 22, another crystalline nitrogen-containing film 23 of aluminum nitride or the like may be formed in contact with the nitride semiconductors, so that protective film 25 having high reflectance is formed thereon. While second cavity facet 22 is inevitably formed by the −c-planes when first cavity facet 21 is formed by the +c-planes, this conceivably results in no particular problem.

Nitrogen-containing film 23, oxide film 24 and protective film 25 can be formed by ECR (Electron Cyclotron Resonance) sputtering or MBE (molecular Beam Epitaxy), for example.

The nitride semiconductor laser device prepared in the aforementioned manner has an excellent high output characteristic and high reliability.

While the crystal planes and directions must essentially be expressed with bars provided above the relevant numerals, the bars (-) are substitutionally provided in front of the relevant numerals in this specification, due to a restriction in the expression means.

Although the present invention has been described and illustrated in detail, it is clearly understood that the same is by way of illustration and example only and is not to be taken by way of limitation, the scope of the present invention being interpreted by the terms of the appended claims.

The nitride semiconductor laser device according to the present invention can be applied to an electronic information apparatus, lighting fitting etc.

What is claimed is:

1. A nitride semiconductor laser device having a multilayer structure formed by stacking a plurality of nitride semiconductor layers made of hexagonal nitride semiconductors, wherein said multilayer structure is provided with a waveguide structure for guiding a laser beam, said nitride semiconductor layers forming said multilayer structure are stacked in a direction substantially perpendicular to the c-axes of said hexagonal nitride semiconductors constituting said nitride semiconductor layers, a first cavity facet forming a side surface of said waveguide structure is a c-plane having Ga-polarity, a second cavity facet forming another side surface of said waveguide structure opposed to said first cavity facet is a c-plane having N-polarity, a crystalline nitrogen-containing film is formed on the surface of said first cavity facet, and the reflectance of said first cavity facet is smaller than the reflectance of said second cavity facet.

2. The nitride semiconductor laser device according to claim 1, wherein said direction substantially perpendicular to the c-axes of said hexagonal nitride semiconductors constituting said nitride semiconductor layers has inclination of not more than 3° with respect to a direction completely perpendicular to the c-axes of said hexagonal nitride semiconductors constituting said nitride semiconductor layers.

3. The nitride semiconductor laser device according to claim 1, wherein an oxide film is formed on said nitrogen-containing film.

4. The nitride semiconductor laser device according to claim 1, wherein the crystal axis of said nitrogen-containing film is aligned with the crystal axis of said first cavity facet.

5. The nitride semiconductor laser device according to claim 1, wherein said nitride semiconductor layers forming said multilayer structure are stacked in a direction substantially parallel to the a-axes or the m-axes of said hexagonal nitride semiconductors constituting said nitride semiconductor layers.

6. The nitride semiconductor laser device according to claim 5, wherein said direction substantially parallel to the a-axes or the m-axes of said hexagonal nitride semiconductors constituting said nitride semiconductor layers has inclination of not more than 3° with respect to the a-axes or the m-axes of said hexagonal nitride semiconductors constituting said nitride semiconductor layers.

7. A nitride semiconductor laser device comprising:

a plurality of nitride semiconductor layers made of hexagonal nitride semiconductors and stacked in a direction substantially perpendicular to c-axes of the hexagonal nitride semiconductors so as to form a multilayer structure, the multilayer structure including a waveguide structure configured to guide a laser beam, the waveguide structure including a first cavity facet and an opposing second cavity facet, the first cavity facet being a c-plane having Ga-polarity, the second cavity facet being a c-plane having N-polarity, a reflectance of the first cavity facet being smaller than that of the second cavity facet; and a crystalline nitrogen-containing film on the first cavity facet a protective film on the second cavity facet.

8. The nitride semiconductor laser device according to claim 7, wherein the direction substantially perpendicular to the c-axes of the hexagonal nitride semiconductors includes a direction completely perpendicular to the c-axes of the hexagonal nitride semiconductors as well as an inclination of not more than 3° with respect to the direction completely perpendicular to the c-axes of the hexagonal nitride semiconductors.

9. The nitride semiconductor laser device according to claim 7, further comprising:

an oxide film on the nitrogen-containing film.

10. The nitride semiconductor laser device according to claim 7, wherein a crystal axis of the nitrogen-containing film is aligned with a crystal axis of the first cavity facet.

11. The nitride semiconductor laser device according to claim 7, wherein the nitride semiconductor layers are stacked in a direction substantially parallel to a-axes or m-axes of the hexagonal nitride semiconductors.

12. The nitride semiconductor laser device according to claim 11, wherein the direction substantially parallel to the a-axes or the m-axes of the hexagonal nitride semiconductors includes a direction completely parallel to the a-axes or the m-axes of the hexagonal nitride semiconductors as well as an inclination of not more than 3° with respect to the a-axes or the m-axes of the hexagonal nitride semiconductors.

* * * * *